United States Patent
Sakai

(10) Patent No.: US 11,387,726 B2
(45) Date of Patent: Jul. 12, 2022

(54) ROTARY TABLE DEVICE

(71) Applicant: NIPPON THOMPSON CO., LTD., Tokyo (JP)

(72) Inventor: Tetsuya Sakai, Toki (JP)

(73) Assignee: NIPPON THOMPSON CO., LTD., Tokyo (JP)

(*) Notice: Subject to any disclaimer, the term of this patent is extended or adjusted under 35 U.S.C. 154(b) by 110 days.

(21) Appl. No.: 16/737,064

(22) Filed: Jan. 8, 2020

(65) Prior Publication Data
US 2020/0235650 A1    Jul. 23, 2020

(30) Foreign Application Priority Data

Jan. 18, 2019    (JP) .............................. JP2019-007183

(51) Int. Cl.
| | |
|---|---|
| *H02K 41/03* | (2006.01) |
| *H02K 11/22* | (2016.01) |
| *H02K 7/08* | (2006.01) |
| *H01L 21/687* | (2006.01) |

(52) U.S. Cl.
CPC ........... *H02K 41/031* (2013.01); *H02K 7/088* (2013.01); *H02K 11/22* (2016.01); *H01L 21/68764* (2013.01)

(58) Field of Classification Search
CPC ........ H01L 21/68735; H01L 21/68785; H02K 7/088; H02K 11/22; H02K 41/031
See application file for complete search history.

(56) References Cited

U.S. PATENT DOCUMENTS

| | | | | |
|---|---|---|---|---|
| 6,692,237 B1* | 2/2004 | Komatsu | ................... | F01B 9/04 |
| | | | | 277/367 |
| 7,091,636 B2* | 8/2006 | Ohno | ....................... | H02K 7/14 |
| | | | | 310/156.32 |
| 7,202,584 B2* | 4/2007 | Ida | ......................... | H02K 7/088 |
| | | | | 310/13 |
| 2004/0061383 A1* | 4/2004 | Tsuboi | ................... | H02K 41/03 |
| | | | | 310/13 |
| 2017/0121819 A1* | 5/2017 | Swaminathan | ..... | H01J 37/3299 |

FOREIGN PATENT DOCUMENTS

JP            2004072960 A1    3/2004

* cited by examiner

*Primary Examiner* — Naishadh N Desai
(74) *Attorney, Agent, or Firm* — Browdy and Neimark, PLLC

(57) ABSTRACT

Disclosed is a rotary table device which accurately detects the position of a table rotating in relation to a bed over the entire circumference and whose assembly is facilitated by covering an armature assembly with an insulating layer for insulation between the bed and the table. In the rotary table device, a ring member having a ring scale extending over the entire circumference of the ring member is disposed around a lower part of the table having a field magnet extending over the entire circumference of the table. A sensor for reading the ring scale is disposed on the bed on which armature coils of the armature assembly are arranged in the circumferential direction to face the field magnet.

6 Claims, 6 Drawing Sheets

ROTARY TABLE DEVICE

FIELD OF THE INVENTION

The present invention relates to a rotary table device which is used in mechanical apparatuses such as semiconductor manufacturing apparatuses, measuring apparatuses, machine tools, industrial robots, etc. and which includes a linear motor composed of an armature assembly disposed on the bed side and a field magnet disposed on the table side.

BACKGROUND OF THE INVENTION

In recent years, a slide device which is high in thrust force, speed, and responsiveness has been demanded for use in various technical fields in which mechanical apparatuses are used. Specifically, in order to move a movable body such as a workpiece, equipment, or the like at high speed, or accurately position a table (movable body) in relation to a base such as a bed or the like, in a multi-axis (e.g., x-y) stage or a motion mechanism section, there has been demand for such a slide device which is high in thrust force, speed, and responsiveness and whose bed and table are compact and light in weight. A linear motor has been used as a drive device for moving the table of the slide device. In general, linear motors are categorized into a moving-coil-type linear motor which includes a plurality of armature coils as a mover and a moving-magnet-type linear motor which includes a field magnet as a mover.

Japanese Patent Application Laid-Open (kokai) No. 2004-72960 discloses a known alignment stage device configured such that a disk-shaped table can rotate to a predetermined certain rotational angle in relation to a stationary bed. In the alignment stage device, the table rotatably supported by the bed via a bearing is rotated by a linear motor. The linear motor is composed of armature coils disposed on the primary side and a field magnet disposed on the secondary side, the field magnet being composed of a large number of plate-shaped field magnets. Each of the armature coils is a three-phase, core-less, flat coil wound in an annular shape. In the above-described alignment stage device, the armature coils are disposed on the bed side to be arranged in the circumferential direction, and the magnets are disposed on the table side to be arranged in the circumferential direction so that the armature coils face the magnets. An armature assembly is composed of an annular base plate formed to extend along the plurality of magnets arranged in the circumferential direction of the table, and the armature coils fixed to the base plate. The armature assembly is fixed to the bed. Also, a tape-shaped scale is bonded to the outer circumferential surface of the table. The scale extends over a region corresponding to the rotational angular range of the table. The position of the table is detected by reading the scale by using an optical sensor disposed on the bed. An insulating sheet is disposed between the armature assembly and the bed, and another insulating sheet is disposed between the armature assembly and the table. The insulating sheets insulate the armature assembly from the bed and the table.

In the above-described alignment stage device, the table swivels within a predetermined rotational angular range. Therefore, the above-described alignment stage device is not designed on the basis of a technical idea of providing a scale over the entire circumference of the table, thereby enabling endless rotation. Namely, in the above-described alignment stage device, since the tape-shaped scale is bonded to a region corresponding to the rotational angular range, in order to rotate the table endlessly, the tape-shaped scale for position detection must be bonded to the entire circumference of the table (over an angle of 360° C.). In this case, joining opposite ends of the scale is difficult, and therefore, stabilization of quality is difficult. Also, in the above-described alignment stage device, a first insulating sheet for providing insulation between the armature assembly and the bed and a second insulating sheet for providing insulation between the armature assembly and the table are disposed separately. Therefore, at the time of assembly of the table, the first insulating sheet must be inserted between the armature assembly and the bed, and the second insulating sheet must be inserted between the armature assembly and the table. Accordingly, the above-described alignment stage device has a problem in that the number of components is large, and assembly involves increased man-hours. Also, the armature assembly and the first and second insulating sheets are disposed on the bed while the positions of mounting holes, etc. of the armature assembly are aligned with the positions of mounting holes, etc. of the insulating sheets. Such alignment operation is difficult. Also, in the conventional alignment stage device, the first insulating sheet is inserted between the bed and the armature coils at the time of assembly of the table.

SUMMARY OF THE INVENTION

The present invention has been conceived to solve the above problem, and an object of the present invention is to provide an improved rotary table device which endlessly rotates a table in relation to a bed disposed at a predetermined position. In the improved rotary table device, a ring scale is provided over the entire circumference of a ring member disposed over the entire circumference of a lower part of the table, and an armature assembly is covered with an insulator so as to insulate the armature assembly from the bed and the table and to facilitate assembling work. In the improved rotary table device, the position of the table in relation to the bed can be measured over the entire circumference, and thus, the position of the rotating table can be detected accurately. Further, the improved rotary table device is compact and increases the degree of freedom in designing the table on which a field magnet is disposed and the bed on which the armature assembly is disposed.

Means to Solve the Problems

The present invention relates to a rotary table device comprising a bed disposed at a predetermined location, a disk-shaped table rotatably mounted on the bed via a bearing, and a motor for rotating the table. The motor includes an armature assembly on a primary side of the motor and a field magnet on a secondary side of the motor. The armature assembly includes a plurality of armature coils, each of which is a three-phase, core-less, flat coil wound in an annular shape and which are circumferentially arranged in an annular recess formed in a top surface of the bed. The field magnet includes a plurality of plate-shaped magnets which are circumferentially arranged in an annular recess formed in a bottom surface of the table such that the magnets face the armature coils and provide N and S poles alternatingly in a circumferential direction. The table has a lower part having the bottom surface on which the field magnet is disposed and facing the bed, and a placement part which is integrally formed with the lower part and to which a counterpart member is attached. The rotary table device further comprises a ring member disposed around the lower part of the table and extending over the entire circumference of the lower part, a ring scale provided over the entire outer circumferential surface of the ring member, and a sensor disposed on the bed so as to read the ring scale.

Preferably, the outer circumferential surface of the lower part of the table is located radially inward of the outer circumferential surface of the placement part, and the outer circumferential surface of the ring scale attached to the lower part is located radially inward of the outer circumferential surface of the placement part.

Preferably, the ring member is fixed to the outer circumferential surface of the lower part of the table through centering location fitting (i.e., spigot fitting).

Preferably, the inner circumferential surface of the ring member fitted onto the lower part of the table is tapered in a direction in which the outer circumferential surface of the lower part of the table is inserted into the ring member.

Preferably, the armature assembly is composed of a ring-shaped base plate extending in the direction of arrangement of the magnets and the armature coils disposed on the base plate such that the armature coils are arranged in the direction of arrangement of the magnets. Preferably, the armature assembly has a first insulating layer provided on a side where the armature coils are present, and a second insulating layer provided on a side where the base plate is present.

Preferably, the first insulating layer is an insulating plate bonded to the armature assembly, and the second insulating layer is an insulating sheet bonded to the base plate or an insulating film applied to the base plate.

Effects of the Invention

As described above, the rotary table device according to the present invention includes a moving-magnet-type linear motor. Since the ring scale is formed on the seamless ring member extending over the entire circumference of the lower part of the table, the ring member having the scale can be readily and appropriately attached to the lower part of the table. In the rotary table device, since the scale surface on the outer circumferential surface of the ring member is located radially inward of the outer circumferential surface of the table, occurrence of a problem that an operator or worker accidentally touches the scale can be prevented. Since the ring member is fitted onto an outer circumferential portion of the lower part of the table through centering location fitting, the ring member can be accurately fixed to the table. Since a taper surface tapered in a table insertion direction is formed on the inner circumferential surface of the ring member, the ring member can be readily fitted onto and attached to the lower part of the table. In some cases, the ring scale can be formed directly on the ring member so as to simplify the structure. In the rotary table device, since insulating layers are formed beforehand on opposite sides of the armature assembly formed by disposing the armature coils on the base plate, insulation between the armature assembly and the bed and insulation between the armature assembly and the table are established by merely incorporating the armature assembly into the bed. Therefore, it is unnecessary to prepare insulating sheets separately. Since the armature assembly has a one-piece structure in which the base plate, the armature coils, and the insulating layers are integrated together, the armature assembly can be readily incorporated into the bed. Therefore, the rotary table device can be assembled readily and properly.

DETAILED DESCRIPTION OF THE EMBODIMENTS

Figure 1:
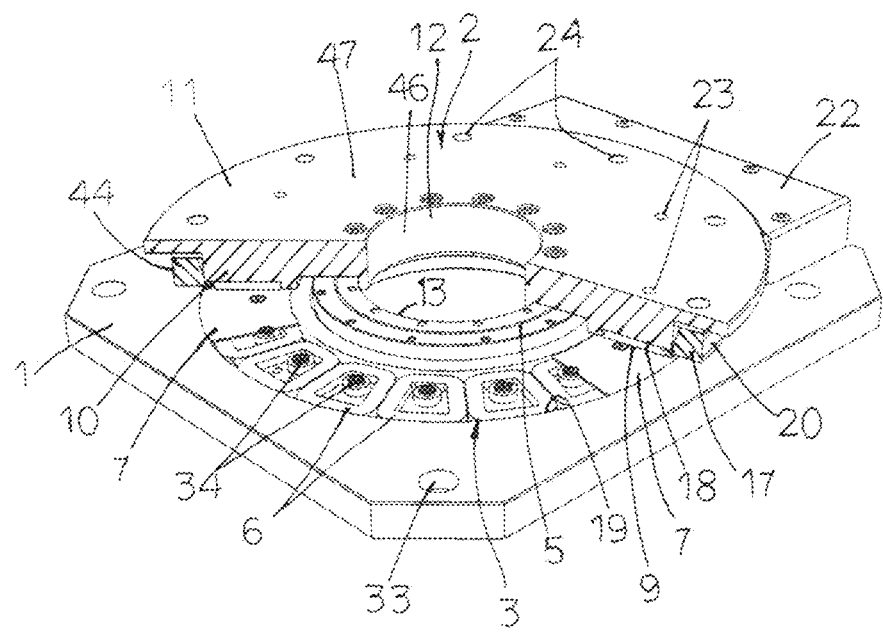
FIG. 1 is a perspective view of a rotary table device according to the present invention, shown in partially cut-away.
Figure 2:
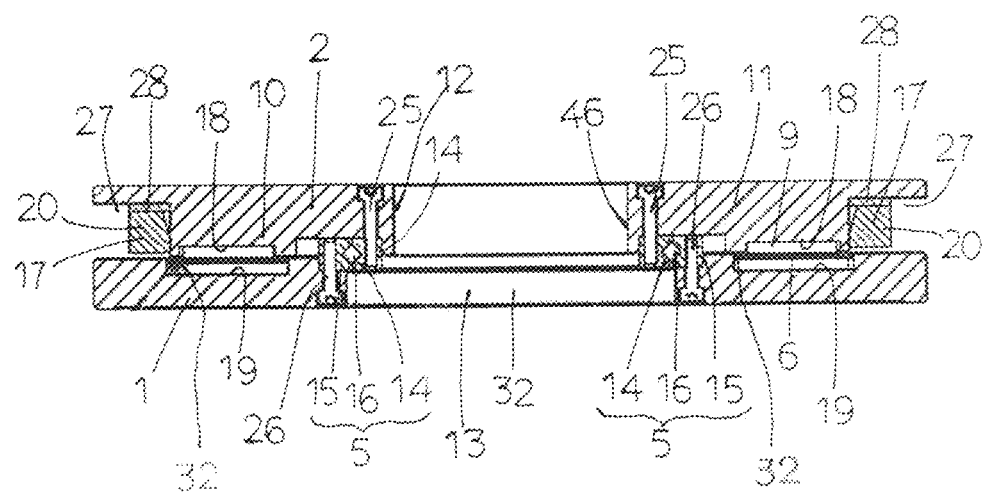
FIG. 2 is a sectional view showing one embodiment of the rotary table device of FIG. 1.
Figure 3:
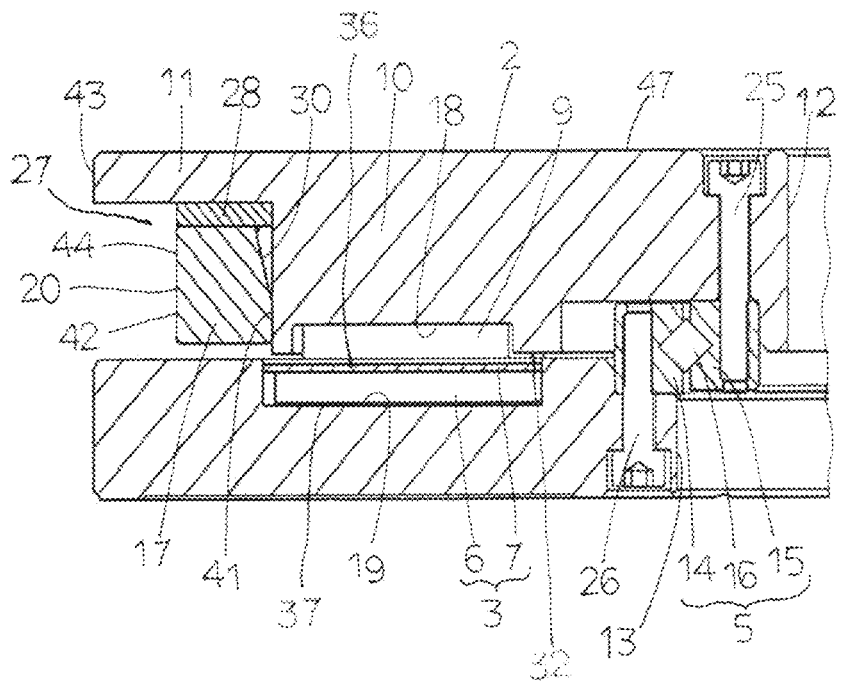
FIG. 3 is a sectional view showing, on an enlarged scale, a portion of the rotary table device of FIG. 2.

Embodiments of a rotary table device according to the present invention will now be described with reference to the drawings. The rotary table device according to the present invention is used in, for example, mechanical apparatuses such as semiconductor-related apparatuses, measuring apparatuses, machine tools, industrial robots, conveyers, etc. In particular, the rotary table device according to the present invention is suitable for a measuring apparatus or a testing apparatus for which accurate positioning is demanded. The rotary table device includes a linear motor which is configured by, for example, disposing an armature assembly 3 on the side toward a bed 1 and disposing a field magnet 4 on the side toward a table 2. The rotary table device is mounted on, for example, an XY table device (orthogonal positioning device) so as to achieve alignment of angular position. The bed 1 has a through hole 13 formed at a center portion thereof, and mounting holes 33 formed at four corners thereof for attachment to a base or the like. The rotary table device is configured such that the table 2 which can be driven in X-axis and Y-axis directions can be fixed to the bed 1. The table 2 has mounting holes 23 for attachment of a counterpart member (e.g., a part or a workpiece) thereto. The table 2, which has a disk-like shape, is formed of, for example, steel (magnetic iron material) and plated with nickel. The table 2 has a through hole 12 formed at its center. Wires and pipes can be passed through the through hole 12 to the top surface 47 of the table 2. The weight of the table 2 can be reduced by an amount corresponding to the volume of the through hole 12.

As shown in FIGS. 1 to 6, the rotary table device according to the present invention generally includes the bed 1 fixedly disposed at a predetermined certain location, the table 2 (e.g., a disk-shaped turn table) rotatably mounted on the bed 1 via a bearing 5 such as a cross roller bearing; and a linear motor which is a permanent magnet motor for rotating the table 2 relative to the bed 1. The cross roller bearing (bearing 5) includes rollers disposed such that the center axes of adjacent rollers are orthogonal to each other. The cross roller bearing is composed of an outer ring 14 fixed to the bed 1 by using fastening screws 26, an inner ring 15 fixed to the table 2 by using fastening screws 25, and a plurality of rollers (including first and second rollers) 16 disposed between the outer ring 14 and the inner ring 15 such that the first rollers and the second rollers are alternatingly arranged and the center axes of the first rollers are orthogonal to the center axes of the second rollers. Since the cross roller bearing can bear radial load, axial load, and moment simultaneously despite being compact, the size of the rotary table device can be reduced, and the rotary table device can be configured as a flat device whose cross section height is small.

The linear motor is composed of the armature assembly 3 including a plurality of armature coils 6 on the primary side (on the bed side) and the field magnet 4 including a plurality of magnets 9 on the secondary side (on the table side). Each of the armature coils 6 is a three-phase, core-less, flat coil wound in an annular shape; specifically, in a trapezoidal shape. The armature coils 6 are disposed on the annular bottom surface of an annular recess 19 formed on the top surface of the bed 1 such that the armature coils 6 are arranged in the circumferential direction. The armature coils 6 are disposed on the bed 1 without formation of gaps therebetween such that their upper bases (shorter sides) are located on the side toward the rotation center of the table 2. Since such a shape of the armature coils 6 increases the length of legs of each armature coil which connect the upper and lower bases thereof, thereby increasing the area of each armature coil, the thrust force of the table 2 can be increased. Each armature coil 6 is molded with an unillustrated insulating resin, and is fixed to a base plate 7 which is a ring-shaped printed wiring board; i.e., a coil substrate. The magnets 9 are formed into the shape of a trapezoidal plate and are disposed on the annular bottom surface of an annular recess 18 formed on the bottom surface 32 of the table 2 such that they are arranged in the circumferential direction so as to provide alternating poles and face the armature coils 6. The table 2 also serves as a magnet yoke for forming a magnetic path for the field magnet 4. The permanent magnet motor for rotating the table 2 is a four-pole, three-phase linear motor which includes the armature coils 6 constituting the armature assembly 3 on the primary side, and the magnets 9 constituting the field magnet 4 on the secondary side. In other words, the permanent magnet motor for rotating the table 2 is a direct drive motor which rotates the table 2 directly.

Figure 8:
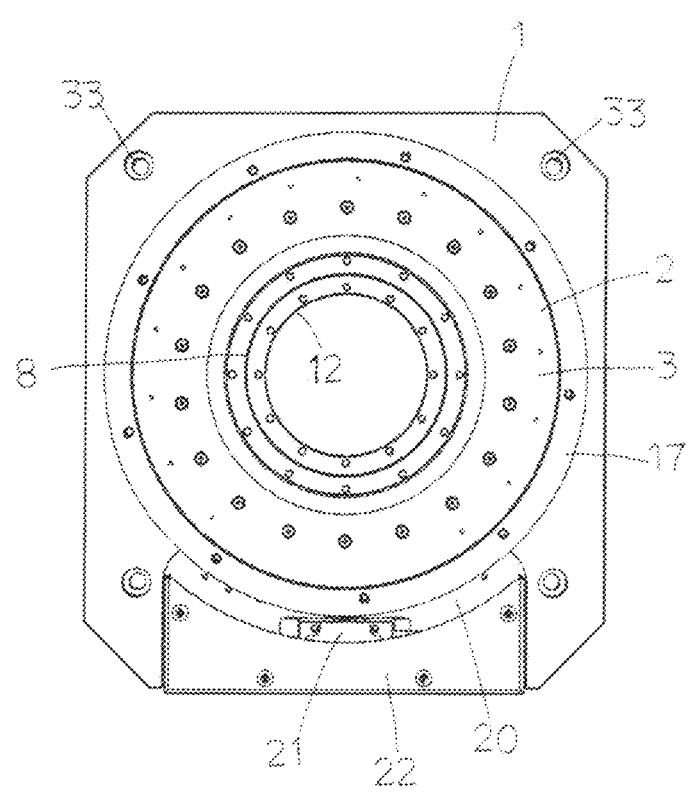
FIG. 8 is a plan view of the rotary table device of FIG. 1 showing the positional relation between the ring scale and a sensor.
Figure 9:
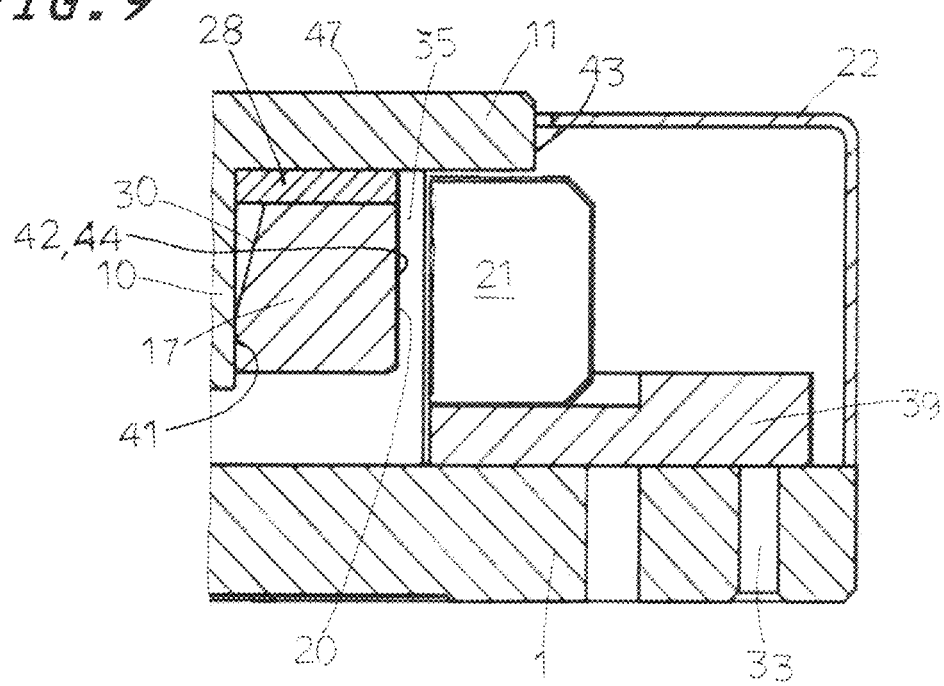
FIG. 9 is a sectional view of the rotary table device of FIG. 1 showing the concept of reading the ring scale.

In particular, the rotary table device according to the present invention is characterized in that a seamless ring scale 20 is disposed at a lower part 10 of the table 2 via a ring member 17 such that the ring scale 20 extends over the entire outer circumferential surface of the lower part 10. The table 2 has a placement part 11 which is located on the upper side and to which a counterpart member such as a workpiece, equipment, or the like is attached, and the lower part 10 which is smaller in diameter than the placement part 11 and is located on the lower side and integrally formed with the placement part 11. The lower part 10 is located on the side where the armature coils 6 face the bed 1. In other words, the ring member 17 is disposed around the lower part 10 of the table 2 and extends over the entire outer circumferential surface 41 of the lower part 10, and the ring scale 20 is provided over the entire outer circumferential surface 42 of the ring member 17. An optical sensor 21 (reading head) for reading the ring scale 20 is disposed on the bed 1. As shown in FIGS. 8 and 9, the optical sensor 21 (reading head) for reading a scale surface (the outer circumferential surface 44 of the ring scale 20) is fixed to the bed 1 via a support base 39 fixed to the bed 1. The optical sensor 21 is covered with a cover 22 fixed to the bed 1. A gap 35 through which the sensor 21 can read the scale surface is formed between the scale surface and the sensor 21. Notably, in FIG. 8, the table 2 and the magnets 9 are not illustrated.

In the rotary table device, the outer circumferential surface 41 of the lower part 10 of the table 2 is located radially inward of the outer circumferential surface 43 of the placement part 11, and the outer circumferential surface 44 of the ring scale 20 attached to the lower part 10 is located radially inward of the outer circumferential surface 43 of the placement part 11. The ring member 17 is fixed to the outer circumferential surface 42 of the lower part 10 of the table 2 through centering location fitting. The inner circumferential surface 45 of the ring member 17 fitted onto the lower part 10 of the table 2 has a taper surface 30 tapered in a direction in which the outer circumferential surface 41 of the lower part 10 of the table 2 is inserted into the ring member 17. The armature assembly 3 is composed of the base plate 7 (ring-shaped coil substrate) formed to extend in the direction of arrangement of the magnets 9, and the armature coils 6 disposed on the base plate 7 such that the armature coils 6 are arranged in the direction of arrangement of the magnets 9. The armature assembly 3 has a first insulating layer provided on the side where the armature coils 6 are present and a second insulating layer provided on the side where the base plate 7 is present. The first and second insulating layers are integrated with the armature assembly 3. The first insulating layer is an insulating plate 36 bonded to the armature assembly 3. The second insulating layer is an insulating film applied to the base plate 7 or an insulating sheet 37 bonded to the base plate 7.

Figure 5:
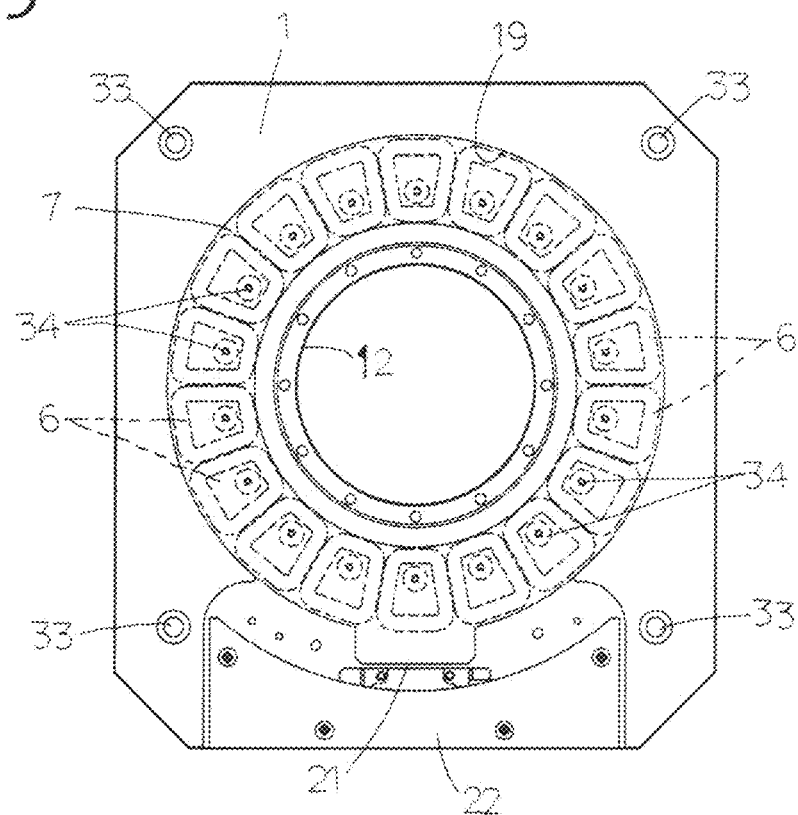
FIG. 5 is a plan view of the rotary table device of FIG. 1 showing a state in which a plurality of armature coils constituting an armature assembly are disposed on the top surface of a bed.
Figure 6:
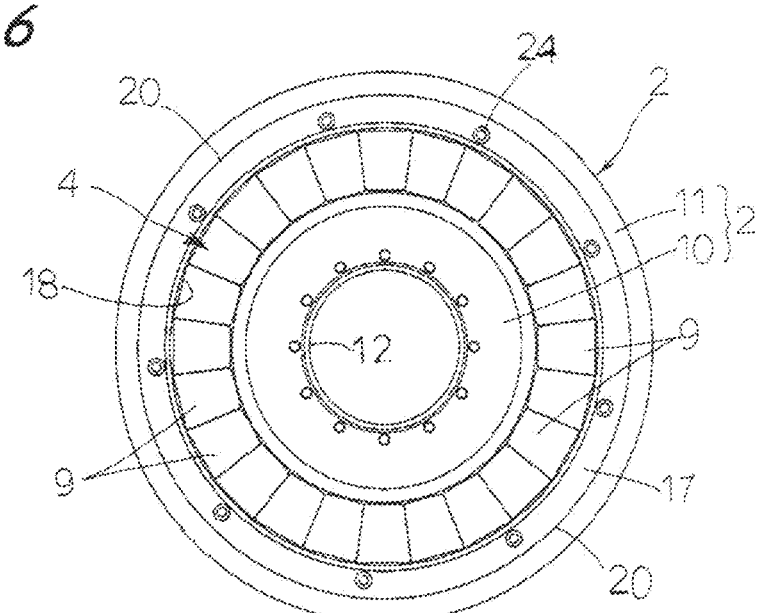
FIG. 6 is a plan view of the rotary table device of FIG. 1 showing a state in which a plurality of magnets constituting a field magnet are disposed on the bottom surface of a table.

Specifically, the rotary table device is formed as follows. Namely, the base plate 7 of the armature assembly 3 is a four-layer printed wiring board which is formed of, for example, glass epoxy resin and in which a plurality of circuit traces each having a predetermined pattern are formed in layers, and the circuit traces are connected to one another (not shown) via holes and are connected to the armature coils 6. An insulating film is formed on the surface of the base plate 7 to which the armature coils 6 are fixed. For example, a double-layer insulating film is formed on the surface through a double resist process. Another insulating film is formed on the opposite surface of the base plate 7. For example, a single-layer insulating film is formed on the opposite surface through a single resist process. The resist process may be a well known resist process such as a solder resist process of printing a predetermined pattern on the base plate 7 with, for example, a UV curing or heating curing resin, by means of screen printing. Notably, instead of the double resist process, a single resist process may be used for the armature assembly 3. In short, insulating films are formed on opposite sides of the plate 7 so as to prevent leakage of electricity from the base plate 7 and enhance the noise resistance of the base plate 7. The armature coils 6 configured as described above are fixed to the entire circumference of the base plate 7, whereby the armature assembly 3 shown in FIG. 5 is formed. When three-phase (U, V, and W phases) electric power is supplied to the armature assembly 3, currents of the three phases flow through three armature coils 6 in each armature coil group. The three armature coils 6 in each armature coil group correspond to four of the magnets 9. The electric power can be supplied to the armature coils 6 by connecting unillustrated power lines to a tongue-shaped land 31 projecting radially outward from the base plate 7. The land 31 has connection portions corresponding to the U, V, and W phases, and the power lines can be connected to these connection portions by means of, for example, solder. The armature assembly 3 configured as described above is screw-fixed to the bed 1 via collars 34 formed of resin such that the armature coils 6 face downward (toward the bed 1), whereby the armature coils 6 can be disposed on the bed 1. Since the base plate 7 provides shielding between the armature coils 6 and the magnets 9, less heat generated by the armature coils 6 is transmitted to the magnets 9. The thrust force of the permanent magnet motor is proportional to the magnetic flux density of the magnets 9. The magnetic flux density depends on temperature. Therefore, when the temperature of the magnets 9 increases, the magnetic flux density decreases, and the thrust force of the motor may decrease. However, in the present embodiment, since the base plate 7 provides shielding between the armature coils 6 and the magnets 9, less heat generated by the armature coils 6 is transmitted to the magnets 9, and a decrease in thrust force due to temperature increase can be suppressed. Further, in the rotary table device, since the magnets 9 are air-cooled by an air flow produced as a result of rotation of the table 2, the decrease in thrust force due to temperature increase can be suppressed further. As a result, in the present embodiment, a cooling device for cooling the magnets 9, etc., becomes unnecessary, and thus, the rotary table device can be made compact. Also, since the annular recess 19 is formed in the bed 1 and the armature coils 6 are disposed in the annular recess 19, the rotary table device can be configured to have a small cross section height.

Specifically, as shown in FIG. 5, in the rotary table device, the magnets 9 are disposed on the lower side (bottom surface side) of the table 2. In the present embodiment, the magnets 9 are disposed along a circle having a predetermined radius of curvature. Since the magnets 9 are disposed in the annular recess 18 which is formed on the lower side (bottom surface side) of the table 2 and extends in the circumferential direction, the cross section height of the table 2 with the magnets 9 attached thereto can be reduced, whereby the table 2 can be made compact. Each of the magnets 9 is, for example, a permanent magnet containing neodymium which is a rare earth element and is formed into the shape of a trapezoidal plate corresponding to the shape of the armature coils 6. The magnets 9 may be fitted into the annular recess 18 of the table 2 and fixed thereto by using an adhesive. Notably, in the case where the magnets 9 can be firmly fixed, by magnetic force, to the table 2 formed of a magnetic material, the magnets 9 can be fixed by magnetic force only, without use of an adhesive. The magnets 9 are disposed over the entire circumference of the table 2 such that the magnets 9 face the armature coils 6. The magnets 9 are disposed such that they are closely adjacent to one another in the circumferential direction and such that N and S poles are alternatingly disposed, i.e., adjacent magnets 9 have N and S poles, respectively. In this embodiment, the rotary table device can be configured such that, for example, three armature coils 6 and four magnets 9 form a single set, and six sets each including three armature coils 6 and four magnets 9 are provided. In other words, the number of the armature coils 6 is 3×n and the number of the magnets 9 is 4×n, where n is a natural number. Specifically, the number of the armature coils 6 disposed on the bed 1 is 18 (=3×6), and the number of the magnets 9 disposed on the table 2 is 24 (=4×6). In each set, four magnets 9 correspond to three armature coils 6.

Figure 4:
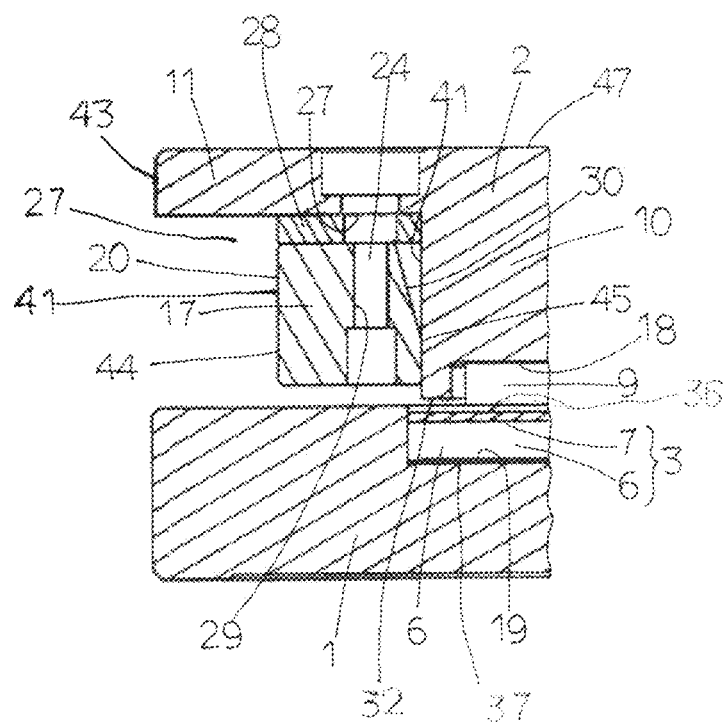
FIG. 4 is an enlarged sectional view showing a ring scale fixedly provided in the rotary table device of FIG. 1.
Figure 7:
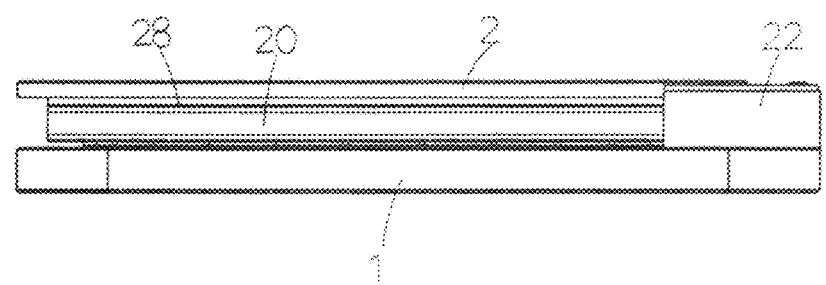
FIG. 7 is a side view of the rotary table device of FIG. 1 showing the ring scale.

Next, there will be described the ring scale 20 disposed on the outer circumferential surface 41 of the lower part 10 of the table 2 of the rotary table device. The ring member 17 on which the ring scale 20 is provided is fixed to the outer circumferential surface 41 of the lower part 10 of the table 2. The ring scale 20 is an optical scale, and, as shown in FIG. 7, the scale is formed over the entirety of the outer circumferential surface 42 of the ring member 17. In the present embodiment, specifically, as shown in FIG. 4, the lower part 10 of the table 2 is inserted into the ring member 17 such that the inner circumferential surface 45 of the ring member 17 is mated with the lower part 10 through centering location fitting. Fastening screws 24 extending through the placement part 11 of the table 2 are screwed into mounting screw holes 29 formed in the ring member 17, whereby the ring member 17 is fixed to the table 2. The taper surface 30 formed on the inner circumferential surface of the ring member 17 and tapered in the insertion direction of the table 2 facilitates an operation of fitting the ring member 17 onto the lower part 10 of the table 2. The ring member 17 is disposed in an undercut-like containment space 27 formed by the bottom surface of the placement part 11 of the table 2 and the outer circumferential surface 41 of the lower part 10 in such a manner that the scale surface which is the outer circumferential surface 44 of the ring scale 20 is located radially inward of the outer circumferential surface 43 of the placement part 11 of the table 2. In other words, the outer circumferential surface 41 of the lower part 10 of the table 2 onto which the ring member 17 can be fitted is located radially inward of the outer circumferential surface 43 of the placement part 11 of the table 2, so that the containment space 27 is formed. The ring member 17 is fitted onto the lower part 10 and fixed by using the fastening screws 24, whereby the ring member 17 is fixed to the table 2. The ring scale 20 and the sensor 21 constitute an optical encoder which can detect the position of the table 2 in relation to the bed 1. Notably, the sensor section is configured such that unillustrated power lines and signal lines are connected to the sensor 21. Since the seamless ring scale 20 is used in the rotary table device as described above, the scale can be readily provided over the entire circumference of the table 2. Also, since the ring scale 20 is formed on the outer circumferential surface 42 of the ring member 17 of the table 2, which member has a large circumferential length, the ring scale 20 can be finely graduated, so that accurate position detection is possible. Further, since the ring member 17 is fitted onto an outer circumferential portion of the lower part 10 of the table 2 through centering location fitting, the ring member 17 (accordingly, the ring scale 20) can be accurately attached to the table 2, so that the rotation center of the table 2 and the center of the ring scale 20 can be readily aligned with each other. Also, in the present embodiment, since the scale surface of the ring scale 20 is disposed radially inward of the outer circumferential surface 43 of the placement part 11 of the table 2, it is possible to prevent an operator or worker from accidentally touching the scale surface. As a result, it is possible to avoid occurrence of a problem that the scale surface becomes dirty and the sensor 21 fails to read the scale. Notably, in the present embodiment, a spacer 28 is disposed between the table 2 and the ring scale 20 so as to adjust the position of the ring scale 20. However, the spacer 28 can be eliminated by adjusting the sizes of the table 2 and the ring scale 20.

Figure 10:
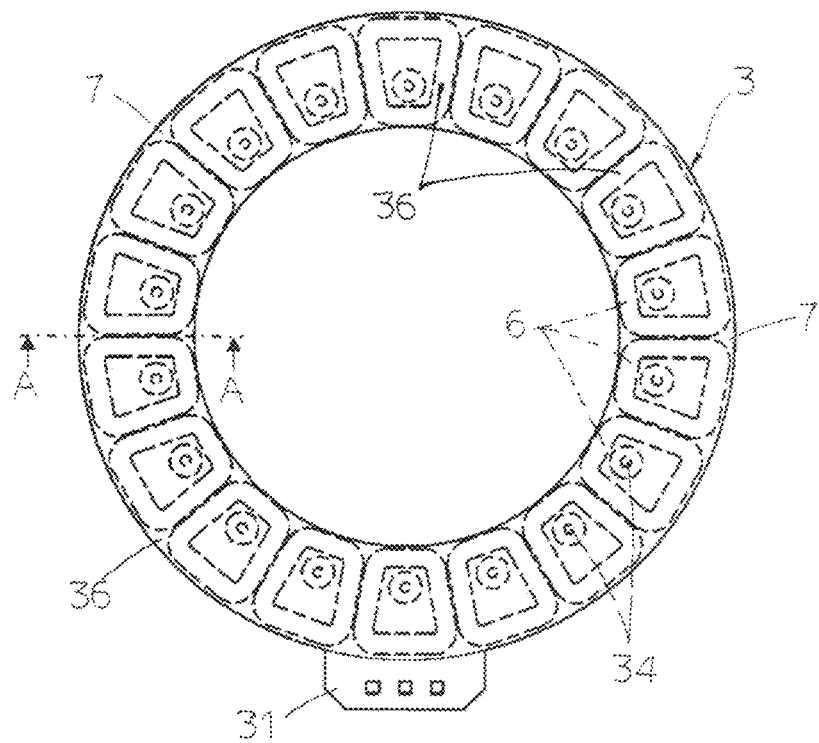
FIG. 10 is a plan view of the rotary table device of FIG. 1 showing the armature assembly.
Figure 11:
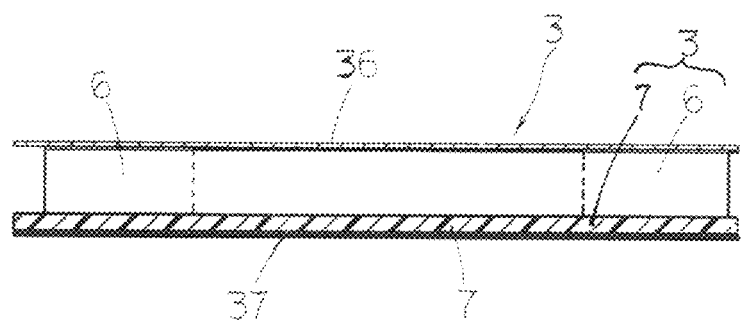
FIG. 11 is a sectional view of the armature assembly taken along line XI-XI of FIG. 10.
Figure 12:
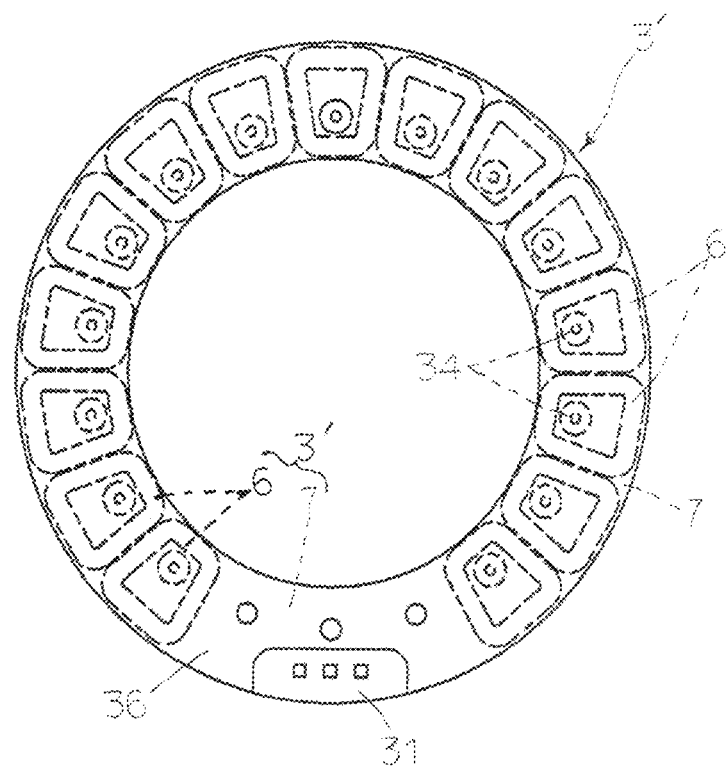
FIG. 12 is a plan view showing another embodiment which is obtained by removing three armature coils from the armature assembly of FIG. 9 and in which a land is disposed within the armature assembly.

Next, the insulating structure of the armature assembly 3 in the rotary table device will be described. As shown in FIG. 10, the insulating plate (first insulating layer) 36 is provided on one side of the armature assembly 3 where the armature coils 6 are present. The insulating plate 36 is formed of, for example, glass epoxy resin (insulating material) and has a thickness of 0.2 mm. The insulating plate 36 is fixed to the armature assembly 3 by using, for example, adhesive. As shown in FIG. 11, the insulating sheet (second insulating layer) 37 is provided on the other side of the armature assembly 3 where the base plate 7 is present. The insulating sheet 37 is a thin sheet formed of, for example, glass epoxy resin (insulating material) and having a thickness of 0.2 mm. The insulating sheet 37 is fixed to the armature assembly 3 by using, for example, adhesive. The insulating plate 36 and the insulating sheet 37 prevent leakage of current from the armature assembly 3 to the outside and prevent external noise from entering an internal circuit or the like. Since the insulating plate 36 and the insulating sheet 37 are bonded to the armature assembly 3 beforehand, insulation is established by merely incorporating the armature assembly 3 into the bed 1. Namely, in the case of the conventional rotary table device, since separate insulating sheets are inserted between the armature assembly and the bed and between the armature assembly and the table, respectively, during assembly, assembling work is complicated. In contrast, according to the embodiment of the rotary table device of the present invention, the insulating sheet insertion work can be eliminated, and the rotary table device can be readily assembled. Therefore, production cost can be reduced. Since the insulating plate 36 and the insulating sheet 37 are fixed directly to the armature assembly 3, insulating properties can be improved, and a sufficiently high withstand voltage can be secured. Since the insulating plate 36 and the insulating sheet 37 are fixed such that they cover the armature coils 6, the armature coils 6 can be protected by the insulating layers. In the present embodiment, since the armature coils 6 and the magnets 9 are disposed flatly, a thin-type rotary table device can be realized. Since the table 2 can be made thin, the mass of an outer circumferential portion of the table 2 having a large rotation radius can be reduced, whereby inertial moment can be reduced. Since the overall weight of the table 2 is reduced through formation of the through hole 12 at the center of the table 2, inertial moment can be reduced further. In the present embodiment, the armature coils 6 are disposed over the entire circumference of the printed wiring board; i.e., the base plate 7. However, an armature assembly 3' shown in FIG. 12 may be employed. The armature assembly 3' is configured such that the number of sets of the armature coils 6 is one smaller than the number of sets of the armature coils 6 in the armature assembly 3, i.e., the number of the armature coils 6 is three smaller than the number of the armature coils 6 in the armature assembly 3. Since this configuration allows formation of the land 31 in a region where the armature coils 6 are not provided, the size of the base plate 7 in the radial direction can be decreased. Meanwhile, in the case where the armature coils 6 are disposed over the entire circumference of the base plate 7 as in the above-described embodiment, the torque of the device can be increased. The method of attaching the insulating sheet 37 which is the second insulating layer on the base plate 7 side is not limited to bonding. An insulating film may be formed by applying a well known insulating material to the base plate 7 by means of silk-screen printing. In this case, an insulating film can be formed on the base plate 7 by utilizing a silk-screen printing device which prints a part number or the like on the base plate 7 which is a printed wiring board, and therefore, it is unnecessary to separately prepare a device for forming the insulating film. In the case where a sufficiently high withstand voltage can be secured by using an insulating film formed by a resist process, the insulating sheet 37 can be omitted. In the above-described embodiments, the armature coils 6 and the magnets 9 have respective trapezoidal shapes. However, each of the armature coils 6 and the magnets 9 may have any of other shapes such as a rectangular shape. Further, the armature coils 6 and the magnets 9 may have different shapes. The rotary table devices of the above-described embodiments can be configured, for example, such that the outer diameter of the table 2 is 200 mm and the overall height of the device is 30 mm. Namely, a flat rotary table device having a small cross section height can be obtained. The resolution of the present device which uses the ring scale 20 is, for example, 0.21 sec, and the repeated positioning accuracy of the present device is, for example, ±0.5 sec. Therefore, the present device can realize accurate positioning. Since the screw-fixing positions of the ring scale 20 are equally spaced from one another, deformation of the outer circumferential surface 44, i.e., the scale surface, at the time of screw fastening can be reduced.

What is claimed is:

1. A rotary table device comprising:
    a bed disposed at a predetermined location;
    a disk-shaped table rotatably mounted on the bed via a bearing; and a motor for rotating the table,
    wherein the motor includes an armature assembly on a primary side of the motor and a field magnet on a secondary side of the motor, the armature assembly including a plurality of armature coils each of which is a three-phase, core-less, flat coil wound in an annular shape and which are circumferentially arranged in an annular recess formed in a top surface of the bed, and the field magnet including a plurality of plate-shaped magnets which are circumferentially arranged in an annular recess formed in a bottom surface of the table such that the magnets face the armature coils and provide N and S poles alternatingly in a circumferential direction,
    wherein the table has a lower part having the bottom surface on which the field magnet is disposed and facing the bed, and a placement part which is integrally formed with the lower part and to which a counterpart member is attached, and
    wherein the rotary table device further comprises: a ring member disposed around the lower part of the table and extending over the entire circumference of the lower part; a ring scale provided over the entire outer circumferential surface of the ring member; and a sensor disposed on the bed so as to read the ring scale.

2. A rotary table device according to claim 1, wherein an outer circumferential surface of the lower part of the table is located radially inward of an outer circumferential surface of the placement part, and an outer circumferential surface of the ring scale attached to the lower part is located radially inward of the outer circumferential surface of the placement part.

3. A rotary table device according to claim 1, wherein the ring member is fixed to the outer circumferential surface of the lower part of the table through centering location fitting.

4. A rotary table device according to claim 1, wherein the ring member is fixed to the outer circumferential surface of the lower part of the table and wherein an inner circumferential surface of the ring member fitted onto the lower part of the table is tapered in a direction in which the outer circumferential surface of the lower part of the table is inserted into the ring member.

5. A rotary table device according to claim 1, wherein the armature assembly is composed of a ring-shaped base plate extending in the direction of arrangement of the magnets and the armature coils disposed on the base plate such that the armature coils are arranged in the direction of arrangement of the magnets, and wherein the armature assembly has a first insulating layer provided on a side where the armature coils are present and a second insulating layer provided on a side where the base plate is present.

6. A rotary table device according to claim 5, wherein the first insulating layer is an insulating plate bonded to the armature assembly, and the second insulating layer is an insulating sheet bonded to the base plate or an insulating film applied to the base plate.

\* \* \* \* \*